(12) United States Patent
Im et al.

(10) Patent No.: US 7,598,111 B2
(45) Date of Patent: Oct. 6, 2009

(54) THIN FILM TRANSISTOR AND METHOD OF MANUFACTURING THE SAME

(75) Inventors: Choong-Youl Im, Suwon-si (KR); Tae-Wook Kang, Suwon-si (KR); Chang-Yong Jeong, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 11/683,288

(22) Filed: Mar. 7, 2007

(65) Prior Publication Data
US 2007/0148833 A1   Jun. 28, 2007

Related U.S. Application Data

(62) Division of application No. 10/992,680, filed on Nov. 22, 2004, now Pat. No. 7,205,565.

(30) Foreign Application Priority Data
Nov. 25, 2003   (KR) ...................... 10-2003-0084246

(51) Int. Cl.
*H01L 21/00*   (2006.01)
(52) U.S. Cl. ............................. 438/82; 438/99; 257/40; 257/E29.151; 257/E39.007; 257/E51.005; 257/E51.022
(58) Field of Classification Search ............... 438/82, 438/99; 257/40, E29.151, E39.007, E51.005, 257/E21.022
See application file for complete search history.

(56) References Cited

U.S. PATENT DOCUMENTS 6,100,954 A    8/2000   Kim et al.

(Continued)

FOREIGN PATENT DOCUMENTS

EP    0603866 B1    6/1994

(Continued)

OTHER PUBLICATIONS

European Search Report, dated Nov. 2, 2005.

(Continued)

*Primary Examiner*—Andy Huynh
(74) *Attorney, Agent, or Firm*—H.C. Park & Associates, PLC

(57) ABSTRACT

A thin film transistor and a method of manufacturing the same are disclosed. More specifically, there is provided a thin film transistor having a thin film transistor and a method of manufacturing the same wherein an inorganic layer and an organic planarization layer are sequentially formed on the surface of a substrate on source/drain electrode of a thin film transistor having a semiconductor layer, a gate, source/drain areas and the source/drain electrodes, and a blanket etching process is performed to the organic planarization layer to planarize the inorganic layer. After forming a photoresist pattern on the inorganic layer, an etching process is performed to form a hole coupling a pixel electrode with one of the source/drain electrodes. According to the manufacturing method, the hole may be formed using one mask, thereby simplifying a manufacturing process, and improving an adhesion with the pixel electrode by the inorganic layer formed above. This thin film transistor may be appropriately applied to the active matrix organic electro luminescence display.

19 Claims, 8 Drawing Sheets

U.S. PATENT DOCUMENTS

| | | |
|---|---|---|
| 6,274,516 B1 | 8/2001 | Kamei et al. |
| 6,277,678 B1 | 8/2001 | Lee |
| 6,294,799 B1 | 9/2001 | Yamazaki et al. |
| 6,835,951 B2 | 12/2004 | Park |
| 2002/0006690 A1 | 1/2002 | Yamazaki et al. |
| 2003/0025444 A1 | 2/2003 | Seo et al. |

FOREIGN PATENT DOCUMENTS

| | | |
|---|---|---|
| EP | 1052701 | 11/2000 |
| JP | 08152651 | 6/1996 |
| JP | 09219453 | 8/1997 |
| JP | 10041518 | 2/1998 |
| JP | 11-326941 | 11/1999 |
| JP | 2002-221736 | 8/2002 |

OTHER PUBLICATIONS

Chinese Office Action dated Jul. 31, 2009.

THIN FILM TRANSISTOR AND METHOD OF MANUFACTURING THE SAME

This application is a divisional of prior application Ser. No. 10/992,680, filed on Nov. 22, 2004, which claims priority from and the benefit of Korean Patent Application No. 10-2003-0084246, filed Nov. 25, 2003, which are all hereby incorporated by reference for all purposes as if fully set forth herein.

BACKGROUND OF THE INVENTION

1. Field of the Invention

The present invention relates to a thin film transistor and method of manufacturing the same wherein, an inorganic layer planarized by an organic planarization layer is applied to reduce the number of masks necessary for forming a contact hole.

2. Discussion of the Related Art

Generally, among flat panel displays, an organic light-emitting display (OLED) has a bigger operating temperature range, superior shock resistance and vibration immunities, a faster response time, and a wider viewing angle, thus it is capable of providing a clearer moving picture. Consequently, the OLED is attracting attention as a next generation flat panel display.

An OLED generates light by electrons and holes combining to form electron-hole pairs in the semiconductor or carriers that may be exited to a higher energy level and drop to a ground level or stable state.

Depending on a driving method, OLEDs are either passive matrix (PM) or active matrix (AM) types. PMOLEDs have a separate driving source, and AMOLEDs utilize thin film transistors (TFT) as switching devices.

FIG. 1 is a cross-sectional view of a conventional AM organic electroluminescence (EL) display. In the method for manufacturing the organic EL display having the above structure, a TFT having a buffer layer (not shown), a semiconductor layer 11, source/drain areas 14-1, 14-2, a gate insulating layer 12, a gate electrode 13, an interlayer insulating layer 15, via holes 16-1, 16-2, and source/drain electrodes 17-1, 17-2 are formed on a substrate 10 by a set of semiconductor manufacturing processes.

Next, an inorganic layer 18-1, preferably, a silicon nitride layer, is deposited on the substrate 10 over the TFT as a passivation layer 18 to cover the source/drain electrodes 17-1, 17-2. After forming a photoresist pattern on the inorganic layer 18-1, a contact hole or a via hole 19-1, which exposes the source/drain electrode 17-2, is formed by an etching process using the photoresist pattern as a mask. The photoresist pattern is then removed by an oxygen plasma process, photoresist strip process, or other similar process.

Next, after forming a photosensitive type or etching type organic planarization layer 18-2 on the contact hole or via hole 19-1 and forming a photoresist pattern, another mask etching process is performed to the photoresist pattern, thereby forming the contact hole or via hole 19 in the organic planarization layer 18-2.

Next, after forming a conductive material on the entire surface of the substrate 10, a typical photolithography process is performed along with exposure, developing and etching processes, thereby forming the pixel electrode 20, which is coupled to the source/drain electrode 17-2 by the contact hole or via hole 19.

A planarization layer 21 is then formed on the entire surface of the substrate 10 to cover the pixel electrode 20, and an opening 22 is formed to expose the pixel electrode 20.

Finally, an AM organic EL display is manufactured by forming an organic layer (not shown) and an upper electrode (not shown) on the pixel electrode 20.

In this case, the contact hole or via hole 19 is formed by two etching processes using the inorganic layer 18-1 and the organic planarization layer 18-2. However, forming the contact hole or via hole 19 using two or more etching processes and at least two masks complicates the manufacturing process.

FIG. 2A, FIG. 2B, and FIG. 2C are scanning electron microscope (SEM) photographs showing a cross section of a TFT manufactured using the above process having the above structure.

FIG. 2A shows an inorganic layer 18-1 deposited on one of the source/drain electrodes 17-1, 17-2, and an organic planarization layer 18-2 deposited thereon. FIG. 2B shows that the contact hole or the via hole 19 has a step caused by the inorganic layer 18-1 and the organic planarization layer 18-2. FIG. 2C shows that delamination (dark portion) and cracks may occur between the organic planarization layer 18-2 and the pixel electrode 20. Delamination may be caused by a poor adhesion between the organic planarization layer 18-2 and the pixel electrode 20, which may allow impurities and moisture to penetrate the device.

SUMMARY OF THE INVENTION

The present invention provides a thin film transistor with improved adhesion between a passivation layer, which is formed on source/drain electrodes, and a pixel electrode.

The present invention also provides a thin film transistor with an increased lifespan.

The present invention also provides a thin film transistor including an inorganic layer formed between source/drain electrodes and a pixel electrode.

The present invention also provides a thin film transistor using less masks to form a contact hole or via hole connecting the pixel electrode with a source/drain electrode.

Additional features of the invention will be set forth in the description which follows, and in part will be apparent from the description, or may be learned by practice of the invention.

The present invention discloses a thin film transistor comprising: a semiconductor layer formed on a substrate; a gate insulating layer formed on the substrate having the semiconductor layer; a gate electrode formed on the gate insulating layer over the semiconductor layer; source/drain areas formed in the semiconductor layer of both sides of the gate; an interlayer insulating layer formed on an entire surface of the substrate and having a contact hole/via hole that exposes source/drain electrodes; the source/drain electrodes formed on the interlayer insulating layer and contacting with the source/drain areas through the contact hole/via hole; and a passivation layer formed between a pixel electrode and the interlayer insulating layer wherein a top of the inorganic layer is exposed on the entire surface of the substrate to directly contact with the pixel electrode, and an organic planarization layer is located on some of the inorganic layer area that does not contact with the pixel electrode.

The present invention also discloses a thin film transistor comprising: a semiconductor layer formed on a substrate; a gate insulating layer formed on the substrate having the semiconductor layer; a gate electrode formed on the gate insulating layer over the semiconductor layer; source/drain areas formed in the semiconductor layer of both sides of the gate; an interlayer insulating layer formed on an entire surface of the substrate and having a contact hole/via hole that exposes source/drain electrodes; source/drain electrodes formed on the interlayer insulating layer and contacting with the source/drain areas through the contact hole/via hole; a pixel electrode formed on the substrate and the source/drain areas and contacting with the source/drain electrodes; a passivation layer formed between the pixel electrode and the interlayer insulating layer and having a contact hole or a via hole that exposes one of the source/drain electrodes, wherein in the passivation layer, a top of the inorganic layer is exposed on the entire surface of the substrate to directly contact with the pixel electrode, and an organic planarization layer is located on an area of the inorganic layer that does not contact with the pixel electrode; and a planarization layer formed on the entire surface of the substrate and having an opening where the pixel electrode is exposed.

The present invention also discloses a method of manufacturing a thin film transistor, comprising: forming a semiconductor layer on a substrate; forming a gate insulating layer on the substrate having the semiconductor layer; forming a gate on the gate insulating layer on the semiconductor layer; ion-implanting impurities into the semiconductor layer to form source/drain areas in the semiconductor layer of both sides of the gate; forming an interlayer insulating layer on the entire surface of the substrate; etching a selected area of the interlayer insulating layer to form a contact hole/via hole that exposes the source/drain areas; forming source/drain electrodes that contact with the source/drain areas through the contact hole/via hole formed on the interlayer insulating layer; sequentially forming an inorganic layer and an organic planarization layer as a passivation layer on the entire surface of the substrate; blanket etching the organic planarization layer to expose a top of the inorganic layer; and etching a selected area of the inorganic layer to form a contact hole or a via hole that exposes one of the source/drain electrodes.

The present invention also discloses a method of planarizing a thin film transistor, comprising: arranging a thin film transistor having a semiconductor layer, a gate, source/drain areas and source/drain electrodes; forming an inorganic layer and an organic planarization layer on an entire surface of a substrate to cover the source/drain electrodes; and blanket etching the organic planarization layer until a top of the inorganic layer is exposed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
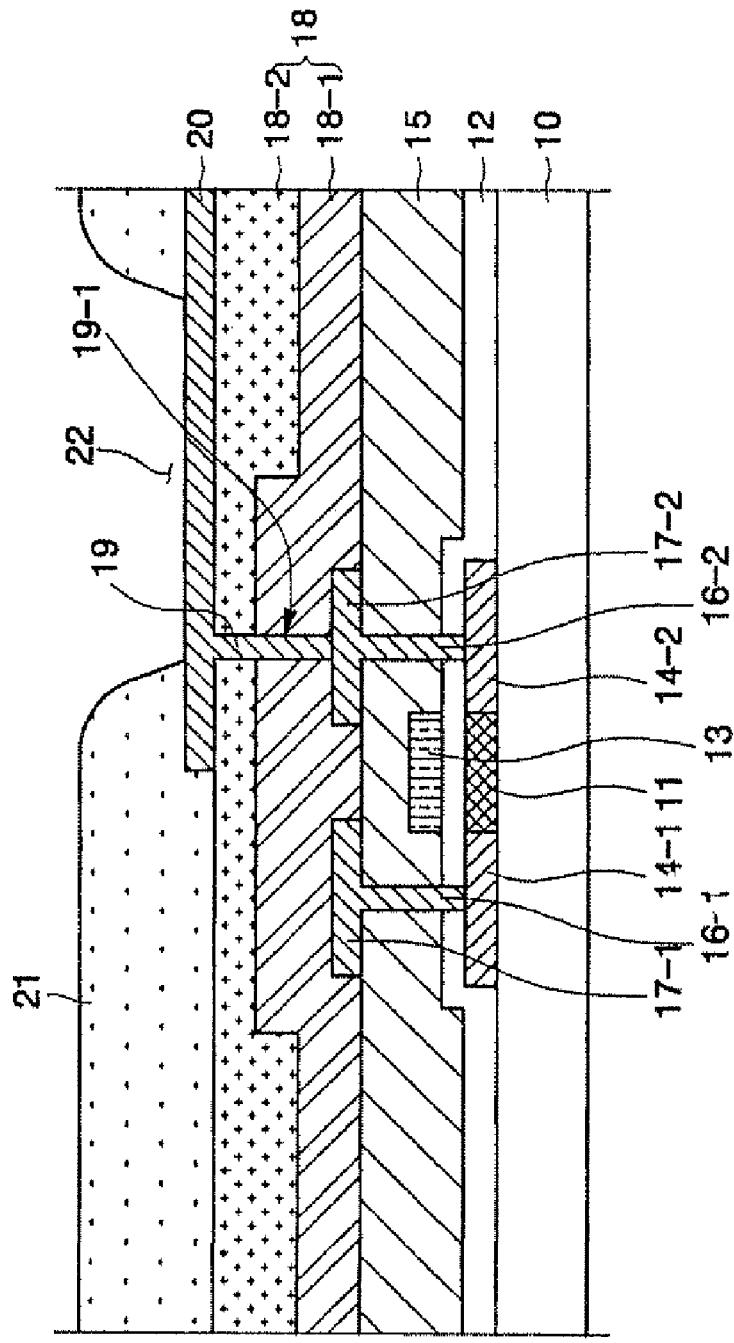
FIG. 1 is a cross-sectional view of a conventional active matrix (AM) organic electroluminescence (EL) display.
Figure 2A:
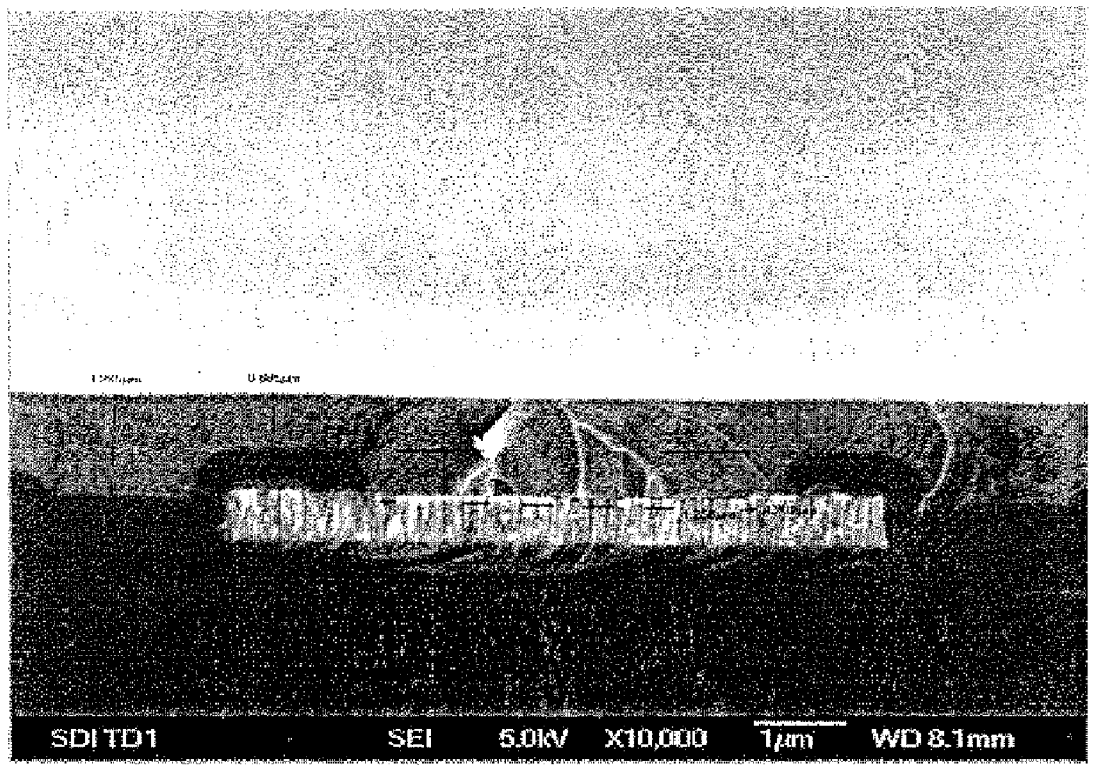
FIG. 2A, FIG. 2B, and FIG. 2C are scanning electron microscope (SEM) photographs showing a cross section of a thin film transistor (TFT) of an AM organic EL display.
Figure 2B:
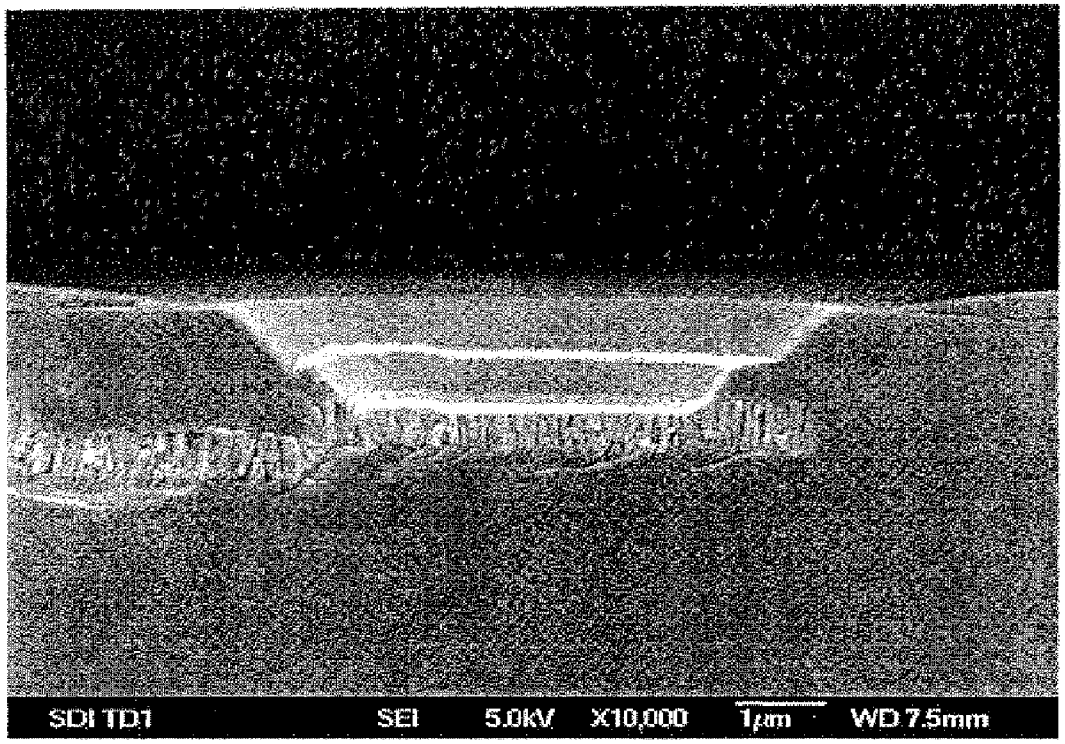
Figure 2C:
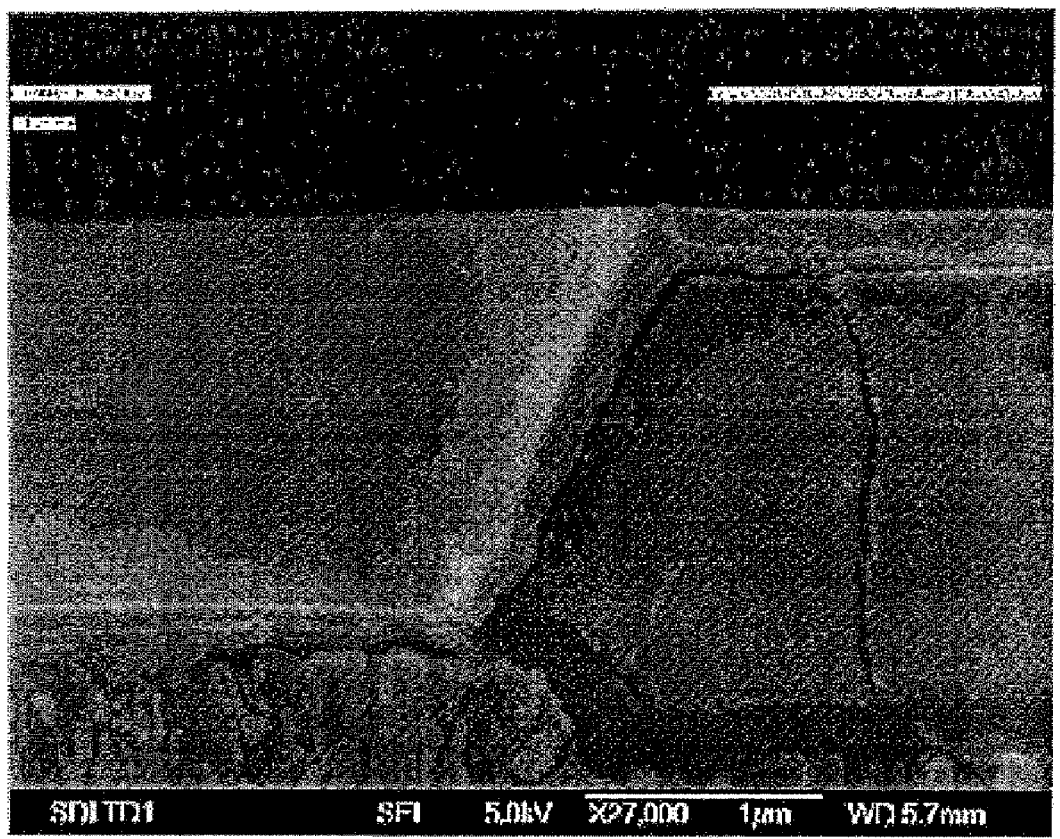

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification. Forming something "on" something else does not require actual physical contact.

Figure 3:
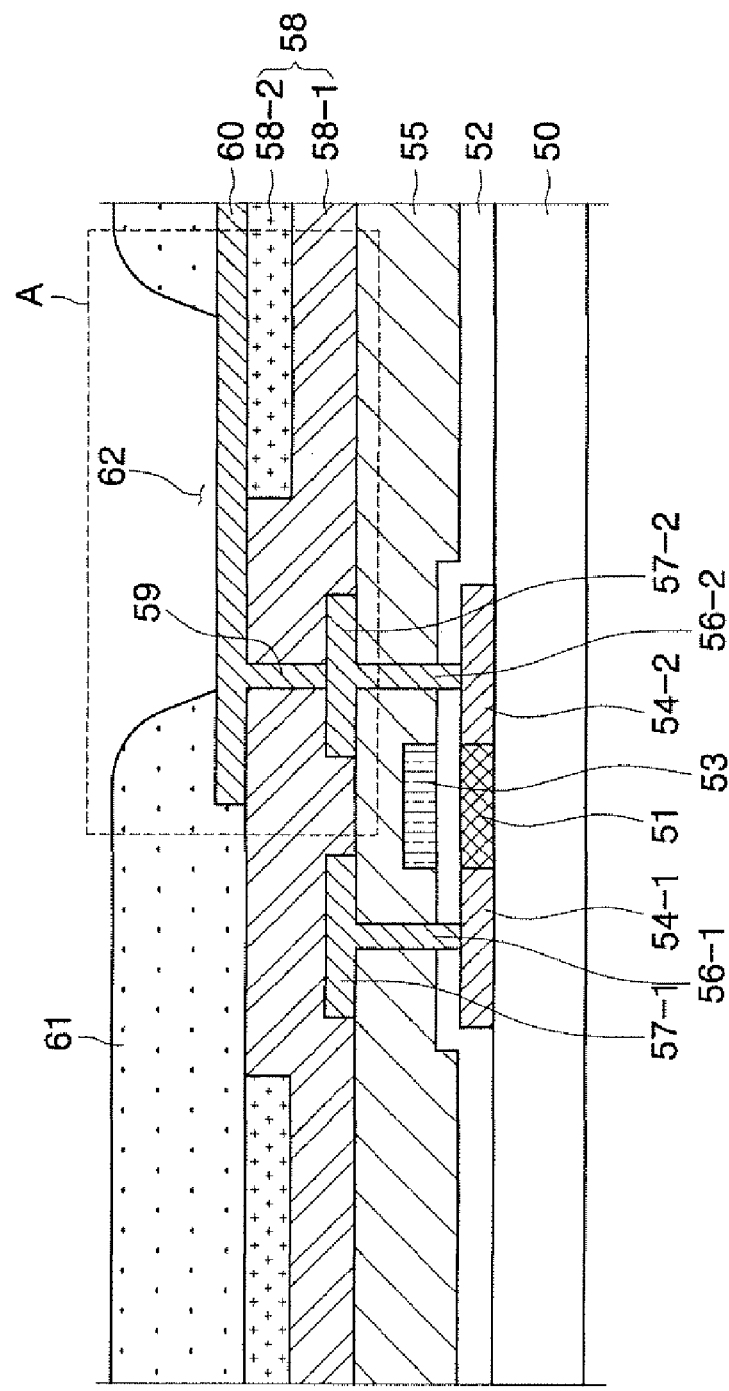
FIG. 3 is a cross-sectional view of an AM organic EL display having a thin film transistor according to an exemplary embodiment of the present invention.

FIG. 3 is a cross-sectional view of an AM organic EL display having a thin film transistor according to an exemplary embodiment of the present invention, and FIG. 4A, FIG. 4B, FIG. 4C, FIG. 4D, and FIG. 4E are cross-sectional views of the area 'A' of FIG. 3 for showing a method for manufacturing the EL display device, where F comprises an underlying structure below the source/drain electrodes. FIG. 5 is a SEM photograph showing the 'A' area of FIG. 3.

Referring to FIG. 3, a polysilicon layer is formed by a conventional process on a transparent insulating substrate 50, such as a glass substrate or plastic, and is patterned to form a semiconductor layer 51 having an island shape.

A gate insulating layer 52 is formed on the semiconductor layer 51. A gate metal layer is deposited and patterned on the gate insulating layer 52 to form a gate electrode 53.

Next, an n-type or a p-type impurity is ion-implanted into the semiconductor layer 51 to form source/drain areas 54-1, 54-2 in the semiconductor layer 51. An interlayer insulating layer 55 is formed on the gate insulating layer 52 and the gate electrode 53.

Next, a photoresist pattern (PR) is formed on the interlayer insulating layer 55, and using the photoresist pattern as a mask, contact holes or via holes 56-1, 56-2 are formed by etching selected areas, thereby exposing the source/drain areas 54-1, 54-2.

Next, source/drain electrodes 57-1, 57-2 are formed by depositing and patterning a metal material on the interlayer insulating layer 55 and the contact holes/via holes 56-1, 56-2. The source/drain electrodes 57-1, 57-2 are coupled to the source/drain areas 54-1, 54-2 through the contact holes/via holes 56-1, 56-2.

Figure 4A:
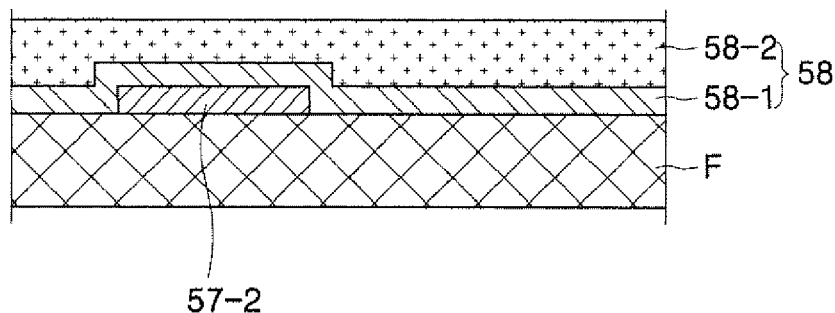
FIG. 4A, FIG. 4B, FIG. 4C, FIG. 4D, and FIG. 4E are cross-sectional views illustrating a method for manufacturing an AM organic EL display having a thin film transistor according to an exemplary embodiment of the present invention.
Figure 4B:
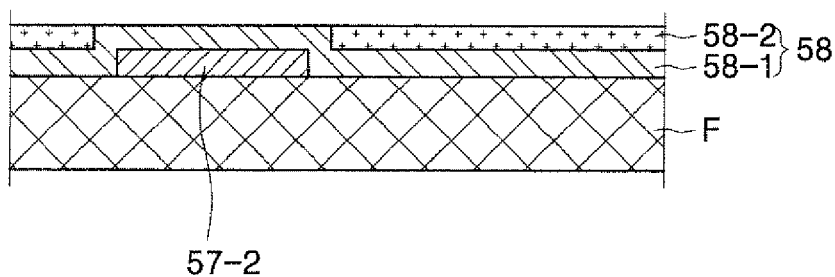
Figure 5:
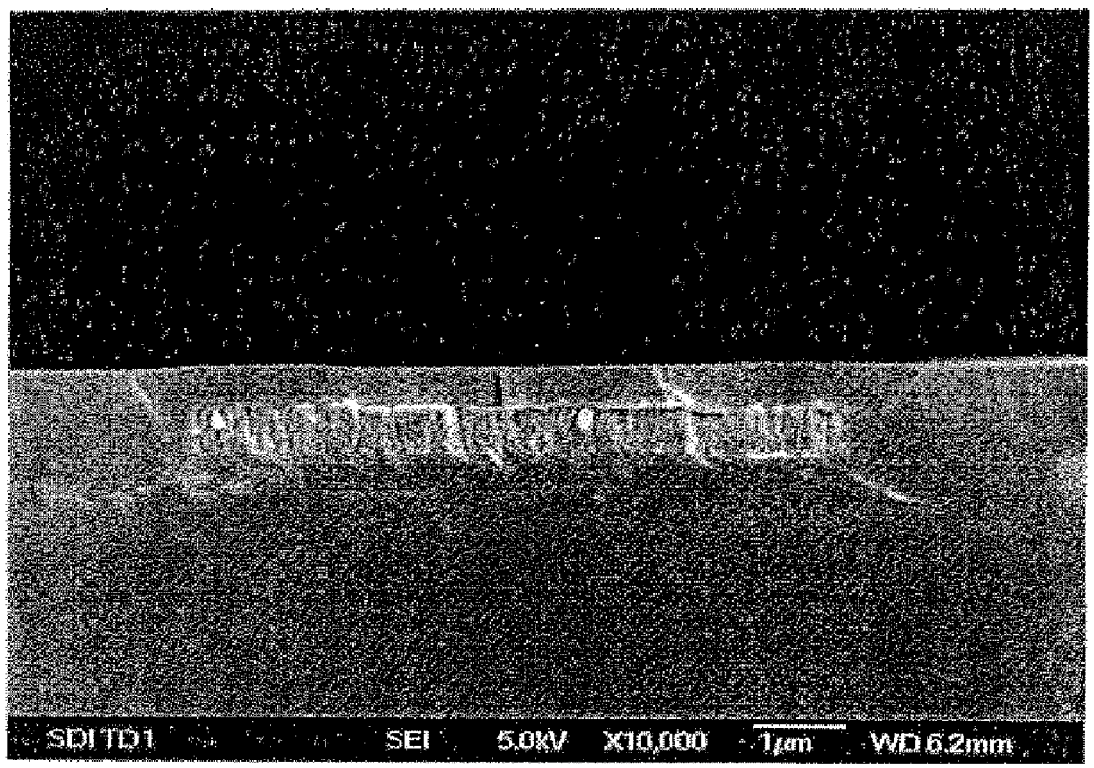
FIG. 5 is a SEM photograph showing a cross section of a thin film transistor of an AM organic EL display.

Referring to FIG. 4A and FIG. 4B, an inorganic layer 58-1 and an organic planarization layer 58-2 are sequentially formed on the entire surface of the substrate, as a passivation layer 58, to cover the source/drain electrodes 57-1, 57-2. A blanket etching process is then performed to the organic planarization layer 58-2 until the top of the inorganic layer 58-1 is exposed.

The blanket etching process may be performed such that etch selectivity of the inorganic layer 58-1 to the organic planarization layer 58-2 is within a range of about 0.3 to about 3.0, and preferably, within a range of about 0.5 to about 2.0.

Preferably, the blanket etching process is a dry etching process. The dry etching process may be a physical dry etching process, such as ion beam etching and RF sputtering etching; a chemical dry etching process; or a physical-chemical dry etching process, such as plasma etching, reactive ion etching, reactive sputtering etching, reactive ion beam etching, electron induced chemical dry etching and photon induced chemical dry etching. Since a desired etch shape may not be obtained from a wet etching process, the dry etching process is preferred.

FIG. 5, which shows a planarized inorganic layer 58-1 after a blanket etching process, also shows that the inorganic layer 58-1 is formed on one of the source/drain electrodes, and the organic planarization layer 58-2 exists on both sides of the inorganic layer 58-1.

A silicon nitride layer or a silicon oxide layer may be used to form the inorganic layer 58-1. This inorganic layer 58-1 serves as a barrier that may prevent diffusion of external moisture or impurities, and also as a passivation layer protecting the source/drain electrodes 57-1, 57-2.

A photosensitive organic polymer or an etch type organic compound may be used to form the organic planarization layer 58-2. The photosensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). Benzocyclobutene (BCB) is commonly used as an organic planarization layer because it has a flatness of at least 95%, a small absorption rate and a good adhesion, and a transmissivity of at least 90%.

Figure 4C:
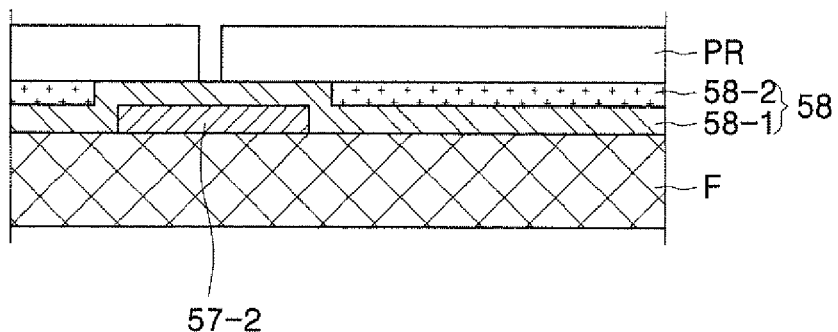
Figure 4D:
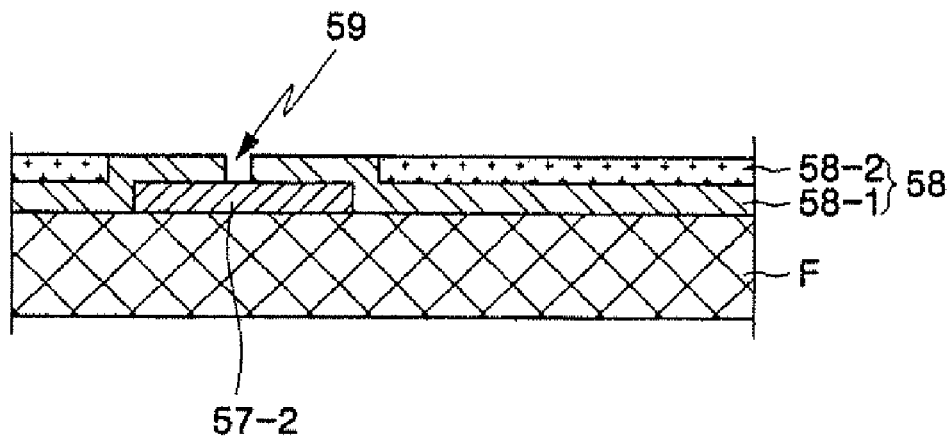
Figure 4E:
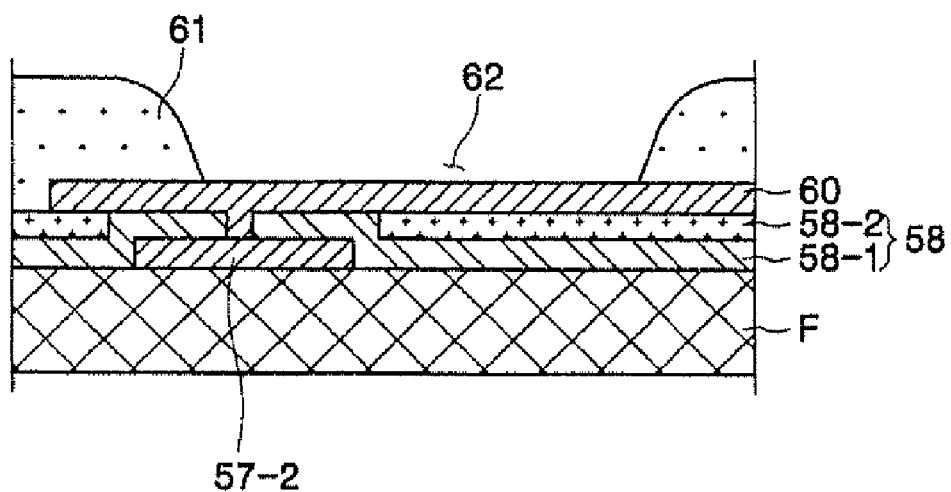

Referring to FIG. 4C, FIG. 4D, and FIG. 4E, the photoresist pattern PR is formed on the organic layer 58-2, and then a contact hole or a via hole 59 is formed by etching an area selected to comprise the inorganic layer 58-1, using the photoresist pattern as a mask. Therefore, a source/drain electrode 57-2 may be electrically coupled with a pixel electrode 60 through the contact hole or via hole 59, to finish a thin film transistor according to an exemplary embodiment of the present invention.

As described above, the contact hole or via hole 59 coupling the pixel electrode with the source/drain electrode 57-2 is etched using one mask, rather than two, per the prior art.

The etching process for forming the contact hole or via hole 59 may be a wet etching process or a dry etching process, but preferably, a dry etching process. Various methods including ion beam etching, RF sputtering etching, and reactive ion beam etching RIE may be used as a dry etching process.

The inorganic layer 58-1, planarized by the blanket etching process, directly contacts the pixel electrode 60. For the inorganic layer 58-1, the adhesion with a pixel electrode made of a metal material may be excellent, which may prevent delamination of the pixel electrode 60 caused by poor adhesion between the passivation layer 58 and the pixel electrode 60.

More specifically, the planarized inorganic layer 58-1 of an exemplary embodiment of the present invention may prevent delamination or cracking of the organic planarization layer 58-2 and the pixel electrode 60 due to the poor adhesion between the organic organization layer 58-2 and the pixel electrode 60. Consequently, penetration of moisture and impurities may be prevented, thereby increasing a lifespan of a thin film transistor and an AM organic EL display using the same.

Also, a single etching process may be used instead of two to form the contact hole or via hole 59, thereby simplifying the manufacturing process.

Further, the aforementioned thin film transistor may be appropriately introduced into an AM organic EL display.

A thin film transistor may be manufactured comprising a semiconductor layer 51 having source/drain areas 54-1, 54-2, a gate electrode 53, and source/drain electrodes 57-1, 57-2, and further comprising a contact hole or a via hole 59 for coupling the pixel electrode 60 with the source/drain electrode 57-2 through a series of semiconductor processes according to an exemplary embodiment of the present invention.

The passivation layer 58 having the contact hole or via hole 59 may be formed of the inorganic layer 58-1 on the entire surface of the substrate 50.

The pixel electrode 60 is then formed on the passivation layer 58 and electrically coupled with one of the source/drain electrodes 57-1, 57-2 through the contact hole or via hole 59.

An insulating layer for planarization 61, having an opening 62 exposing the pixel electrode 60, is then formed on the passivation layer 58 and an edge portion of the pixel electrode 60.

Next, although not shown, an organic layer may be formed on the pixel electrode 60 at the opening 62, and an upper electrode may be formed on the insulating layer that comprises the organic layer. Once encapsulated, an AM organic EL display is manufactured.

As described above and shown in FIG. 3, the thin film transistor (TFT) may be a top-gate structure TFT. However, the TFT may also be a bottom-gate structure TFT.

As described above, according to a method of manufacturing a thin film transistor according to an exemplary embodiment of the present invention, the contact hole or via hole electrically coupling the pixel electrode with a source/drain electrode is formed using one mask, thereby simplifying the overall process.

Further, in the present invention, the inorganic layer with the exposed upper portion is formed, and the exposed portion directly contacts with the pixel electrode, thereby improving the adhesion between the passivation layer and the pixel electrode.

Further, the passivation layer includes a planarized inorganic layer, which may protect the source/drain electrodes from external impurities and moisture, thereby increasing the thin film transistor's lifespan.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a thin film transistor, comprising:

forming a semiconductor layer on a substrate;

forming a gate insulating layer on the substrate having the semiconductor layer;

forming a gate on the gate insulating layer on the semiconductor layer;

ion-implanting impurities into the semiconductor layer to form source/drain areas in the semiconductor layer at both sides of the gate electrode;

forming an interlayer insulating layer on the entire surface of the substrate;

etching a selected area of the interlayer insulating layer to form a contact hole/via hole that exposes the source/drain areas;

forming source/drain electrodes that contact with the source/drain areas through the contact hole/via hole formed on the interlayer insulating layer;

sequentially forming an inorganic layer and an organic planarization layer as a passivation layer on the entire surface of the substrate;

blanket etching the organic planarization layer to expose a top of the inorganic layer; and etching a selected area of the inorganic layer to form a contact hole or a via hole that exposes one of the source/drain electrodes, where the top of the inorganic layer contacts a pixel electrode, and the organic planarization layer is located on an area of the inorganic layer that does not contact the pixel electrode.

2. The method according to claim 1, wherein the blanket etching process is performed until the top of the inorganic layer is exposed.

3. The method according to claim 2, wherein the blanket etching process is performed such that etch selectivity of the inorganic layer to the organic planarization layer is within a range of about 0.3 to 3.0.

4. The method according to claim 2, wherein the blanket etching process is performed such that etch selectivity of the inorganic layer to the organic planarization layer is within a range of about 0.5 to 2.0.

5. The method according to claim 2, wherein the blanket etching process is a dry etching process.

6. The method according to claim 5, wherein the dry etching process is selected from a group consisting of a physical dry etching process such as ion beam etching and RF sputtering etching; a chemical dry etching process; and a physical-chemical dry etching process such as plasma etching, reactive ion etching, reactive sputtering etching, reactive ion beam etching, electron induced chemical dry etching and photon induced chemical dry etching.

7. A method of planarizing a thin film transistor, comprising:

arranging a thin film transistor having a semiconductor layer, a gate electrode, source/drain areas, and source/drain electrodes;

forming an inorganic layer and an organic planarization layer on an entire surface of a substrate to cover the source/drain electrodes; and blanket etching the organic planarization layer until a top of the inorganic layer is exposed, wherein the top of the inorganic layer contacts a pixel electrode, and the organic planarization layer is located on an area of the inorganic layer that does not contact the pixel electrode.

8. The method according to claim 7, wherein the blanket etching process is performed such that etch selectivity of the inorganic layer to the organic planarization layer is within a range of about 0.3 to 3.0.

9. The method according to claim 7, wherein the blanket etching process is performed such that etch selectivity of the inorganic layer to the organic planarization layer is within a range of about 0.5 to 2.0.

10. The method according to claim 7, wherein the blanket etching process is a dry etching process.

11. The method according to claim 10, wherein the dry etching process is selected from a group consisting of a physical dry etching process such as ion beam etching and RF sputtering etching; a chemical dry etching process; and a physical-chemical dry etching process such as plasma etching, reactive ion etching, reactive sputtering etching, reactive ion beam etching, electron induced chemical dry etching and photon induced chemical dry etching.

12. A method of manufacturing a display device, comprising:

forming a thin film transistor having a semiconductor layer, a gate electrode, source/drain areas, and source/drain electrodes;

sequentially forming an inorganic layer and an organic planarization layer to cover the source/drain electrodes;

blanket etching the organic planarization layer until a top of the inorganic layer is exposed;

forming a contact hole or a via hole in the inorganic layer, the contact hole or the via hole exposing one of the source/drain electrodes; and forming a pixel electrode, the pixel electrode being coupled with the exposed source/drain electrode through the contact hole or the via hole, wherein the top of the inorganic layer contacts the pixel electrode, and the organic planarization layer is located on an area of the inorganic layer that does not contact the pixel electrode.

13. The method according to claim 12, wherein the top of the inorganic layer is substantially coplanar with a top of the organic planarization layer.

14. The method according to claim 13, wherein the pixel electrode contacts the top of the inorganic layer, and the organic planarization layer is located on an area of the inorganic layer that does not contact the pixel electrode.

15. The method according to claim 12, further comprising forming a planarization layer on the substrate, the planarization layer comprising an opening exposing the pixel electrode.

16. The method according to claim 12, wherein the contact hole or the via hole is formed using a single etching process.

17. The method according to claim 16, wherein the single etching process is a dry etching process.

18. The method according to claim 12, wherein the blanket etching process is performed such that etch selectivity of the inorganic layer to the organic planarization layer is within a range of about 0.3 to 3.0.

19. The method according to claim 18, wherein the blanket etching process is a dry etching process.

* * * * *